(12) United States Patent
Su et al.

(10) Patent No.: US 6,340,559 B1
(45) Date of Patent: Jan. 22, 2002

(54) SEMICONDUCTOR DEVELOPING AGENT

(75) Inventors: Wei-Yang Su; Stephen Lee Sjoberg, both of Austin; Wheeler Conrad Crawford, Houston, all of TX (US)

(73) Assignee: Huntsman Petrochemical Corporation, Austin, TX (US)

( * ) Notice: Subject to any disclaimer, the term of this patent is extended or adjusted under 35 U.S.C. 154(b) by 0 days.

(21) Appl. No.: 09/789,654

(22) Filed: Feb. 21, 2001

(51) Int. Cl.[7] ............... G03F 7/32; G03F 7/42; C11D 9/00
(52) U.S. Cl. ............ 430/331; 430/329; 510/176
(58) Field of Search ............... 430/331, 329; 510/176

(56) References Cited

U.S. PATENT DOCUMENTS

| | | | | |
|---|---|---|---|---|
| 4,141,733 A | * | 2/1979 | Guild | 430/331 |
| 4,294,911 A | * | 10/1981 | Guild | 430/331 |
| 4,464,461 A | * | 8/1984 | Guild | 430/331 |
| 5,185,235 A | * | 2/1993 | Sato et al. | 430/331 |
| 6,245,406 B1 | * | 6/2001 | Leon et al. | 510/176 |

* cited by examiner

*Primary Examiner*—Richard L. Schilling
(74) *Attorney, Agent, or Firm*—Russ R. Stolle; Ron D. Brown; Christopher J. Whewell

(57) ABSTRACT

Provided herein are developer solutions useful in producing semiconductor-based circuit elements or precursors thereof, which contain tris-(2-hydroxyethyl)methylammonium hydroxide. Developers according to the invention are either aqueous or alcoholic solutions of tris-(2-hydroxyethyl)methylammonium hydroxide which preferably further comprise a stabilizer. Through use of the compositions provided herein, greatly reduced levels of volatile amines are released during the developing process which lessens the burden on clean room atmosphere purification equipment owing to lessened airborne impurities.

8 Claims, No Drawings

SEMICONDUCTOR DEVELOPING AGENT

This invention relates to compositions of matter useful as developing agents in the manufacture of integrated circuits and other semi-conductor derived circuitry elements made by either additive or subtractive processes. More particularly, it relates to developer agents for use in the semiconductor industry which contain methyl triethanolammonium ions. More particularly, it relates to solutions of developer agents for use in the semiconductor industry which contain methyl triethanolammonium hydroxide, which may also be referred to as tris(2-hydroxyethyl) methylammonium hydroxide.

BACKGROUND

Integrated circuits are typically constructed by depositing a series of individual layers of predetermined materials on a wafer shaped semiconductor substrate, or "wafer". The individual layers of the integrated circuit are in turn produced by a series of manufacturing steps. For example, in forming an individual circuit layer on a wafer containing a previously formed circuit layer, an oxide, such as silicon dioxide, is deposited over the previously formed circuit layer to provide an insulating layer for the circuit. A pattern for the next circuit layer is then formed on the wafer using a radiation alterable material, known as photoresist. Photoresist materials are generally composed of a mixture of organic resins, sensitizers and solvents. Sensitizers are compounds, such as diazonapthaquinones, that undergo a chemical change upon exposure to radiant energy, such as visible and ultraviolet light resulting in an irradiated material having differing salvation characteristics with respect to various solvents than the non-irradiated material. Resins are used to provide mechanical strength to the photoresist and the solvents serve to lower the viscosity of the photoresist so that it can be uniformly applied to the surface of the wafers. After a photoresist layer is applied to the wafer surface, the solvents are evaporated and the photoresist layer is hardened, usually by heat treating the wafer. The photoresist layer is then selectively irradiated by placing a radiation opaque mask containing a transparent portion defining the pattern for the next circuit layer over the photoresist layer and then exposing the photoresist layer to radiation. The photoresist layer is then exposed to a chemical, known as developer, in which either the irradiated or the non-irradiated photoresist is soluble and the photoresist is removed in the pattern defined by the mask, selectively exposing portions of the underlying insulating layer. The exposed portions of the insulating layer are then selectively removed using an etchant to expose corresponding sections of the underlying circuit layer. The photoresist must be resistant to the etchant, so as to limit the attack of the etchant to only the exposed portions of the insulating layer. Alternatively, the exposed underlying layer(s) may be implanted with ions which do not penetrate the photoresist layer thereby selectively penetrating only those portions of the underlying layer not covered by the photoresist. The remaining photoresist is then stripped using either a solvent, or a strong oxidizer in the form of a liquid or a gas in the plasma state. The next layer is then deposited and the process is repeated until fabrication of the semiconductor device is complete.

Choline (2-hydroxyethyltrimethylammonium hydroxide), bis(2-hydroxyethyl) dimethylammonium hydroxide, and tris (2-hydroxyethyl)methylammonium hydroxide are known photoresist stripping agents used in the printed circuitboard ("PCB") industry. Only choline and tetramethylammonium hydroxide are known to be used as developing agents in the semiconductor manufacture. However, these ammonium hydroxides are not thermally stable, and they tend to release amine vapor due to thermal decomposition during the developing process. This amine vapor can react or become mixed with an essential chemical used in the processing of a semi-conductor based circuit element to form unwanted deposits in the chemical vapor deposition chamber if it is not completely removed from the processing area. Thus, tight engineering controls must be constantly employed to remove these amine vapors. If a composition were available which functioned adequately as a developer, and which did not release appreciable amounts of amine vapor during a developing process in which it was employed, such composition would represent an advance in the art of semiconductor developers. The present invention provides such a developer.

SUMMARY OF THE INVENTION

The present invention provides compositions useful as a developing agents in processing semi-conductor based circuit elements and precursors thereof comprising an aqueous or alcoholic solutions of tris-(2-hydroxyethyl) methylammonium hydroxide, either alone, or more preferably in combination with a stabilizer such as N-hydroxyethyl ethylenediamine.

DETAILED DESCRIPTION

The present invention provides a chemical composition which can be used as a developing agent in the semiconductor processing industry. A developer composition according to the invention comprises tris-(2-hydroxyethyl) methylammonium hydroxide, which significantly reduces the amount of volatile amine generated during the developing process. The generation of a reduced amount of volatile amines during the developing process greatly reduces the level at which internal atmospheric control equipment must operate to remove such undesirable amines from the process area.

The tris-(2-hydroxyethyl)methylammonium hydroxide useful in accordance with the present invention is exemplified by the chemical structure:

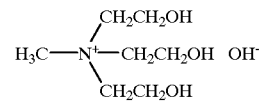

and may be produced by a conventional alkoxylation process according to the general reaction:

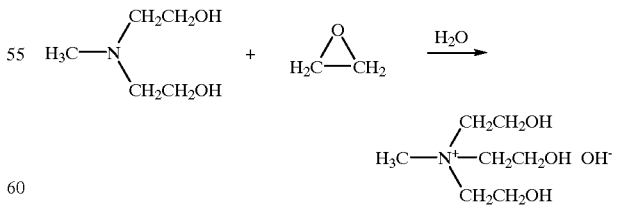

by reacting methyl diethanolamine with ethylene oxide in the presence of water to provide an aqueous solution of tris-(2-hydroxyethyl)methylammonium hydroxide having a strength which is variable by controlling the concentration of the starting materials, as is well-known in the art of alkoxylation using ethylene oxide. Typically, an aqueous solution of tris-(2-hydroxyethyl)methylammonium hydroxide may be prepared having a concentration of between about 10.00 and 80.00% by weight based on the total solution weight, including every hundredth percentage therebetween. By dilution with water, any concentration of tris-(2-hydroxyethyl)methylammonium hydroxide below 80.00% may be achieved. It is most preferred that a developer solution according to the invention contain tris-(2-hydroxyethyl)methylammonium hydroxide in any percentage by weight based upon the total weight of the developer solution between 10.00% and 70.00%, including every hundredth percentage therebetween.

Tris-(2-hydroxyethyl)methylammonium hydroxide shows an unexpected result of being considerably more thermally stable than both choline and bis-(2-hydroxyethyl) dimethyl ammonium hydroxide when employed under conditions normally encountered in the development of semiconductor derived circuitry elements or precursors thereof. While described above as being aqueous solutions, the developers according to the invention may also comprise tris-(2-hydroxyethyl)methylammonium hydroxide in alcohol solution, such as a $C_1$–$C_6$ alcohol, including without limitation methanol and ethanol, merely by conducting the alkoxylation reaction in the selected alcohol, or an aqueous solution of the alcohol.

It is clear that the tris-(2-hydroxyethyl)methylammonium hydroxide of the invention:

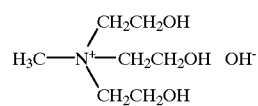

differs from bis-(2-hydroxyethyl) dimethylammonium hydroxide

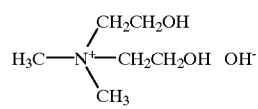

and from choline

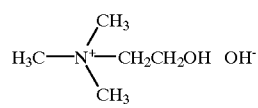

by the number of methyl groups and hydroxy ethyl groups bonded to the nitrogen atom in the quaternary amine.

EXAMPLE 1

Preparation of Bis-(2-hydroxyethyl) dimethyl ammonium hydroxide

A two-liter three-necked flask equipped with a thermometer, magnetic stirrer, dry ice condenser, cooling bath, and nitrogen inlet was charged with about 267 grams of dimethylethanolamine (DMEA) and 330 grams of de-ionized water. About 128 grams of ethylene oxide was fed slowly through a feeding tube into the reaction mixture using moderate agitation, and the reaction temperature was maintained below 20° C. After the ethylene oxide addition was completed, the reaction was allowed to digest for an additional hour. The reaction mixture was then purged with nitrogen for one hour. The product is a clear and colorless solution. However, after about four days of standing at room temperature, the product darkened somewhat.

EXAMPLE 2

Preparation of Tris-(2-hydroxyethyl) methyl ammonium hydroxide

The procedure of Example 1 for the reparation of bis-(2-hydroxyethyl) dimethyl ammonium hydroxide was followed, except that about 357 grams of methyl diethanolamine (MDEA) was used instead of DMEA, 489 grams of de-ionized water, and 115 grams of ethylene oxide were used. The product is a clear and colorless solution. However, after about four days of standing at room temperature, the product darkened somewhat.

EXAMPLE 3

Preparation of Bis-(2-hydroxyethyl)dimethyl ammonium hydroxide

The procedure of Example 1 was followed except that about 267 grams of DMEA, 300 grams of de-ionized water, and 125 grams of ethylene oxide were used. However, at the end of the nitrogen purge, about 4.5 grams of ethylenediamine were added. The product is a clear and colorless solution, and no color change was observed after one month of standing at room temperature.

EXAMPLE 4

Preparation of Bis-(2-hydroxyethyl)dimethyl ammonium hydroxide

The procedure of Example 1 was followed except that about 356 grams of DMEA, 400 grams of de-ionized water, and 170 grams of ethylene oxide were used. At the end of the nitrogen purge, about 9 grams of aminoethylethanolamine (AEEA) was added. The product is a clear and colorless solution, and no color change was observed after one month of standing at room temperature.

EXAMPLE 5

Preparation of Tris-(2-hydroxyethyl)methyl ammonium hydroxide

The procedure of Example 1 was followed, except that about 357 grams of MDEA instead of DMEA, 360 grams of de-ionized water, and 125 grams of ethylene oxide were used. At the end of the nitrogen purge, about 6 grams of ethylenediamine was added. The product is a clear and colorless solution, and no color change was observed after one month of standing at room temperature.

EXAMPLE 6

Preparation of Tris-(2-hydroxyethyl)methyl ammonium hydroxide

The procedure of Example 5 was followed except that about 8 grams of AEEA instead of EDA was employed. A clear and colorless product was obtained, and no color change was observed after a month standing at room temperature.

Thermostability Study

A head space GC-MS analysis method was used to conduct a thermostability study. About 10 ml of sample was put in a sample vial and then, heated at 80° C. to reach equilibrium. A 500 microliter volume of vapor was injected and analyzed. Samples of Example 3 and Example 6 and choline were evaluated. In the case of choline, a significant amount of light amines, such as trimethyl amine, an unknown alkyl amine, ethylpyrazine, diethylpyrazine, and triethylpyrazine were detected. In the case of bis-(2-hydroxyethyl)dimethyl ammonium hydroxide, also, a significant amount of light amines, such as dimethylamine and dimethylethylamine, and DMEA were detected. However, in the case of tris-(2-hydroxyethyl)methyl ammonium hydroxide, only trace amounts of amine were detected. These results indicated that the tris-(2-hydroxyethyl)methyl, unlike the other ammonium hydroxides, is very stable at 80° C.

While displaying beneficial properties, compositions according to the invention are not as stable alone as when one or more stabilizers are present in them. One especially beneficial stabilizer is exemplified by the formula:

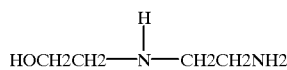

which is known as N-(2-hydroxyethyl) ethylenediamine. Other suitable stabilizers include: N-(2-hydroxypropyl) ethylenediamine; N-(2-hydroxyethyl)-1,2-propylenediamine; N-(2-hydroxypropyl)-1,2-propylenediamine; N-(2-hydroxybutyl)ethylenediamine; N-(2-hydroxybutyl)-1,2-propylenediamine. The preferred concentration of the stabilizer is between about 1.00 and 30.00 grams per liter, including every hundredth gram per liter therebetween. A stabilizer as used herein may be added to an aqueous or alcoholic solution of tris-(2-hydroxyethyl) methylammonium hydroxide and stirred until homogeneous.

While the compositions of the invention are suitable for processing semiconductor-derived circuit elements using silicon wafers and the like, the compositions are also useful in conventional printed circuitboard processing in which photoresists are exposed, developed, and stripped according to methods well-known in the art, including those discussed in U.S. Pat. No. 5,017,271 and the references cited therein, which are herein incorporated by reference thereto.

Consideration must be given to the fact that although this invention has been described and disclosed in relation to certain preferred embodiments, obvious equivalent modifications and alterations thereof will become apparent to one of ordinary skill in this art upon reading and understanding this specification and the claims appended hereto. Accordingly, the presently disclosed invention is intended to cover all such modifications and alterations, and is limited only by the scope of the claims which follow.

What is claimed is:

1. A composition useful as a developing agent in processing semi-conductor based circuit elements and precursors thereof comprising an aqueous solution of tris-(2-hydroxyethyl)methylammonium hydroxide, wherein the concentration of tris-(2-hydroxyethyl) methylammonium hydroxide is between 10.00% and 80.00% by weight based upon the total weight of the composition, including every hundredth percentage therebetween, and further comprising a stabilizer selected from the group consisting of: N-(2-hydroxypropyl)ethylenediamine; N-(2-hydroxyethyl)-1,2-propylenediamine; N-(2-hydroxypropyl)-1,2-propylenediamine; N-(2-hydroxybutyl)ethylenediamine; N-(2-hydroxybutyl)-1,2-propylenediamine; and N-(2-hydroxyethyl)ethylenediamine.

2. A composition according to claim 1 wherein the concentration of the stabilizer is between 1.00 and 30.00 grams per liter, including every hundredth gram per liter therebetween.

3. A composition according to claim 1 further comprising an alcohol selected from the group consisting of: methanol, ethanol, and any alcohol having between 3 and 6 carbon atoms per molecule, including 3 and 6 carbon atoms, in any amount between 200 and 800 grams per liter, including every hundredth gram therebetween.

4. A composition useful as a developing agent in processing semi-conductor based circuit elements and precursors thereof comprising an alcoholic solution of tris-(2-hydroxyethyl)methylammonium hydroxide, wherein the concentration of tris-(2-hydroxyethyl)methylammonium hydroxide is between 10.00% and 80.00% by weight based upon the total weight of the composition, including every hundredth percentage therebetween, and further comprising a stabilizer selected from the group consisting of: N-(2-hydroxypropyl)ethylenediamine; N-(2-hydroxyethyl)-1,2-propylenediamine; N-(2-hydroxypropyl)-1,2-propylenediamine; N-(2-hydroxybutyl)ethylenediamine; N-(2-hydroxybutyl)-1,2-propylenediamine; and N-(2-hydroxyethyl)ethylenediamine.

5. A composition according to claim 4 wherein the concentration of the stabilizer is between 1.00 and 3.00 grams per liter, including every hundredth gram per liter therebetween.

6. A composition according to claim 4 further comprising water in any amount between 200.00 and 980.00 grams per liter, including every hundredth gram therebetween.

7. A composition according to claim 4 wherein said alcohol is any alcohol having between 1 and 6 carbon atoms per molecule.

8. A composition according to claim 7 wherein said alcohol is selected from the group consisting of: methanol, ethanol, 1-propanol, 2-propanol, 1-butanol, 2-butanol, 1-pentanol, 2-pentanol, 3-pentanol, 1-hexanol, 2-hexanol, 3-hexanol, tertiary-butyl alcohol, and sec-butyl alcohol.

* * * * *

UNITED STATES PATENT AND TRADEMARK OFFICE
CERTIFICATE OF CORRECTION

PATENT NO. : 6,340,559 B1
DATED : January 22, 2002
INVENTOR(S) : Su et al.

It is certified that error appears in the above-identified patent and that said Letters Patent is hereby corrected as shown below:

<u>Title page,</u>
Item [*] Notice, "by 0 days" and insert -- by 12 days --.

Signed and Sealed this

Second Day of May, 2006

JON W. DUDAS
*Director of the United States Patent and Trademark Office*